(12) United States Patent
Zhang et al.

(10) Patent No.: US 11,985,826 B2
(45) Date of Patent: May 14, 2024

(54) THREE-DIMENSIONAL MEMORY DEVICE HAVING ADJOINED SOURCE CONTACT STRUCTURES AND METHODS FOR FORMING THE SAME

(71) Applicant: YANGTZE MEMORY TECHNOLOGIES CO., LTD., Wuhan (CN)

(72) Inventors: Lu Zhang, Wuhan (CN); Zhipeng Wu, Wuhan (CN); Bo Xu, Wuhan (CN); Kai Han, Wuhan (CN); Chuan Yang, Wuhan (CN); Zi Yin, Wuhan (CN); Liuqun Xie, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 350 days.

(21) Appl. No.: 17/365,948

(22) Filed: Jul. 1, 2021

(65) Prior Publication Data

US 2021/0335814 A1 Oct. 28, 2021

Related U.S. Application Data

(60) Division of application No. 16/862,338, filed on Apr. 29, 2020, now Pat. No. 11,665,901, which is a
(Continued)

(51) Int. Cl.
*H10B 43/27* (2023.01)
*H10B 43/10* (2023.01)
*H10B 43/35* (2023.01)

(52) U.S. Cl.
CPC ............ *H10B 43/27* (2023.02); *H10B 43/10* (2023.02); *H10B 43/35* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS

2011/0065270 A1 3/2011 Shim et al.
2012/0273965 A1 11/2012 Seo et al.
(Continued)

FOREIGN PATENT DOCUMENTS

CN 106935592 A 7/2017
CN 107731833 A 2/2018
(Continued)

OTHER PUBLICATIONS

International Search Report issued in corresponding International Application No. PCT/CN2020/073415, dated Oct. 26, 2020, 4 pages.

*Primary Examiner* — Didarul A Mazumder
*Assistant Examiner* — Gustavo G Ramallo
(74) *Attorney, Agent, or Firm* — BAYES PLLC

(57) ABSTRACT

A plurality of holes are formed extending vertically in a first dielectric deck that includes interleaved a plurality of first sacrificial layers and a plurality of first dielectric layers over a substrate. A plurality of sacrificial structures are formed in the holes. A second dielectric deck is formed having interleaved a plurality of second sacrificial layers and a plurality of second dielectric layers over the first dielectric deck. A slit opening is formed extending in the second dielectric deck, the slit opening aligned with and over the sacrificial source contact structures. The sacrificial structures are removed through the slit openings such that the slit opening is in contact with the holes to form a slit structure. A plurality of conductor layers are formed in the first and second dielectric decks through the slit structure, forming a memory stack. A source contact structure is formed in the slit structure.

20 Claims, 12 Drawing Sheets

Related U.S. Application Data continuation of application No. PCT/CN2020/073415, filed on Jan. 21, 2020.

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | |
|---|---|---|
| 2013/0248980 A1 | 9/2013 | Han et al. |
| 2014/0042519 A1 | 2/2014 | Lee |
| 2014/0295632 A1 | 10/2014 | Lee et al. |
| 2015/0236038 A1 | 8/2015 | Pachamuthu et al. |
| 2015/0287735 A1 | 10/2015 | Jeon et al. |
| 2016/0079254 A1 | 3/2016 | Shimura |
| 2016/0190155 A1 | 6/2016 | Lee et al. |
| 2017/0047334 A1* | 2/2017 | Lu .................. H10B 43/10 |
| 2017/0278861 A1 | 9/2017 | Sonehara et al. |
| 2017/0345841 A1* | 11/2017 | Wu .................. H10B 41/44 |
| 2018/0006054 A1 | 1/2018 | Liu et al. |
| 2018/0374862 A1 | 12/2018 | Lee et al. |
| 2019/0252404 A1* | 8/2019 | Kaminaga .......... H10B 43/27 |

FOREIGN PATENT DOCUMENTS

| | | |
|---|---|---|
| CN | 108377660 A | 8/2018 |
| CN | 109155319 A | 1/2019 |
| CN | 109496361 A | 3/2019 |
| CN | 109844949 A | 6/2019 |
| CN | 110197830 A | 9/2019 |
| CN | 110581137 A | 12/2019 |
| JP | 2012015517 A | 1/2012 |
| JP | 2017147337 A | 8/2017 |
| KR | 20150116995 A | 10/2015 |
| TW | 201547010 A | 12/2015 |
| TW | I681549 B | 1/2020 |

* cited by examiner

THREE-DIMENSIONAL MEMORY DEVICE HAVING ADJOINED SOURCE CONTACT STRUCTURES AND METHODS FOR FORMING THE SAME

CROSS-REFERENCE TO RELATED APPLICATIONS

This application is a divisional of U.S. application Ser. No. 16/862,338, filed on Apr. 29, 2020, entitled "THREE-DIMENSIONAL MEMORY DEVICE HAVING ADJOINED SOURCE CONTACT STRUCTURES AND METHODS FOR FORMING THE SAME," which is a continuation of International Application No. PCT/CN2020/073415, filed on Jan. 21, 2020, entitled "THREE-DIMENSIONAL MEMORY DEVICE HAVING ADJOINED SOURCE CONTACT STRUCTURES AND METHODS FOR FORMING THE SAME," both of which are hereby incorporated by reference in their entireties.

BACKGROUND

Embodiments of the present disclosure relate to three-dimensional (3D) memory devices, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices with adjoined source contact structures and methods for forming the 3D memory devices are provided.

In one example, a memory device includes a substrate, a stack above the substrate, a channel structure, and a source contact structure each extending vertically through the memory stack. The source contact structure includes (i) a plurality of first source contact portions each extending vertically and laterally separated from one another and (ii) a second source contact portion extending vertically over and in contact with the plurality of first source contact portions, the second source contact portion being laterally continuous.

In another example, a memory device includes a substrate, a stack above the substrate, a plurality of channel structures, and a plurality of source contact structures. The source contact structures include a plurality of first source contact structures and a plurality of second source contact structures, each extending vertically through the memory stack. The first source contact structures each includes (i) a plurality of first source contact portions each extending vertically and separated from one another and (ii) a second source contact portion extending vertically over and in contact with the plurality of first source contact portions, the second source contact portion being continuous. The second source contact structures each extends continuously in the memory stack.

In a further example, a method for forming a memory device includes the following operations. A plurality of holes are formed extending vertically in a first dielectric deck that includes interleaved a plurality of first sacrificial layers and a plurality of first dielectric layers over a substrate. A plurality of sacrificial structures are formed in the holes. A second dielectric deck is formed having interleaved a plurality of second sacrificial layers and a plurality of second dielectric layers over the first dielectric deck. A slit opening is formed extending in the second dielectric deck, the slit opening aligned with and over the sacrificial source contact structures. The sacrificial structures are removed through the slit openings such that the slit opening is in contact with the holes to form a slit structure. A plurality of conductor layers are formed in the first and second dielectric decks through the slit structure, forming a memory stack. A source contact structure is formed in the slit structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
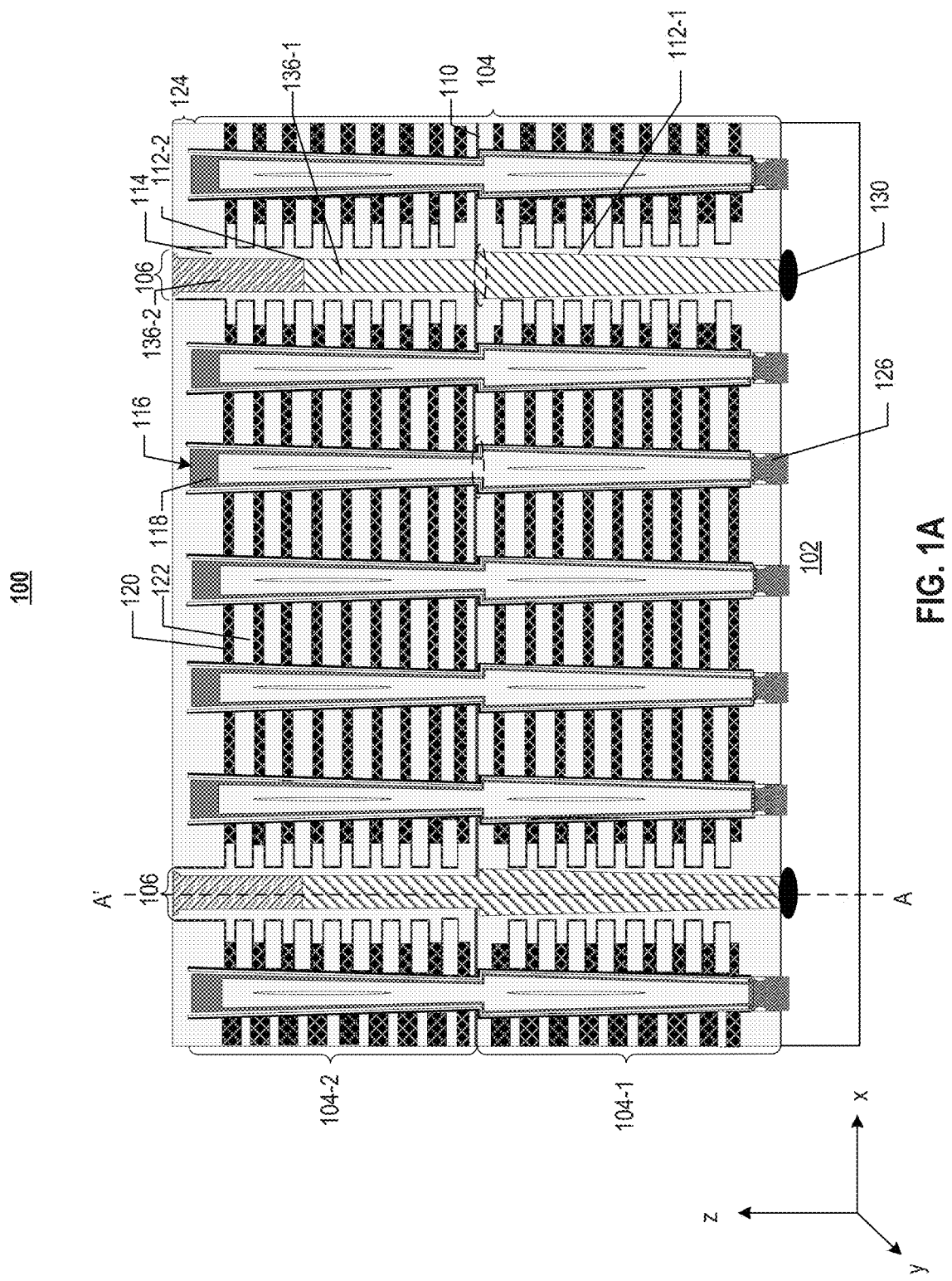
FIG. 1A illustrates a cross-sectional view of an exemplary 3D memory device having adjoined source contact structures, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a gate line slit (GLS), in which an array common source (ACS) is formed. In the fabrication method to form existing 3D NAND memory devices, GLSs are often formed by etching through the entire stack of conductor/dielectric layer pairs.

As the demand for higher memory capacity continues, 3D NAND memory devices with multi-deck structures have been proposed. Compared to existing 3D NAND memory devices, 3D NAND memory devices with multi-deck structures often have more levels (or conductor/dielectric layer pairs) along the vertical direction. Due to an increased number of levels, the existing etching method to form GLSs become challenging. For example, in the existing fabrication process, GLSs are often formed in a one-step etching process after channel structures. The pattern change from the staircase region (e.g., in which stairs are formed) to the core region (e.g., in which channel structures are formed) can cause uneven stress in the 3D NAND memory devices. As a result, the GLSs may be deformed in the areas affected by the uneven stress, forming bent/wavy shapes (or "mouse bites" shapes), especially in the lower portion of the 3D memory device. The deformed/bent shape of the GLSs can result in undesirable contact between the GLSs (or ACSs) and channel structures, causing short circuits. Also, in multi-deck structures, GLSs with undesirably high aspect ratios can be formed, and the conductive material(s) used to fill in GLSs and form ACSs can cause undesirably high stress, resulting in deformation or even collapse of the ACSs. The performance of the 3D NAND memory devices can be affected.

The present disclosure provides a 3D memory device (e.g., 3D NAND memory device) having a multi-deck structure, an adjoined source contact structure extending in the 3D memory device, and methods for forming the 3D memory device. The 3D memory device includes at least two decks stacking vertically (e.g., along the z-axis) and an adjoined source contact structure extending in the 3D memory device. The adjoined source contact structure is located in a memory block, separating memory cells into a pair of fingers. In an example, the 3D memory device has a dual-deck structure and the adjoined source contact structure has a plurality of first source contact portions in the first deck (e.g., lower deck) and a second source contact portion in the second deck (e.g., upper deck). The first source contact portions and the second source contact portion are in contact with and conductively connected to each other. In some embodiments, the first source contact portions are separate from one another (e.g., separately distributed along a lateral direction) and are each in contact with the substrate and the second source contact portion. The second source contact portion has a continuous shape (e.g., a cuboid shape that extends continuously along the lateral direction). In some embodiments, the first source contact portions have the same shape (e.g., a cylindrical shape) and include the same material(s), e.g., polysilicon. In some embodiments, the second source contact portion includes polysilicon and/or tungsten. The structure of the source contact structure can reduce the stress imposed by the source contact structure formed with only tungsten.

In the present disclosure, the first holes (in which the first source contact portions are formed) and the second slit opening (in which the second source contact portion is formed) are formed separately. The first holes and the second slit opening are adjoined to form a slit structure. Meanwhile, other structures, such as channel structures, can be partially or fully formed in the same operations that form the source contact structure. In some embodiments, the channel holes are formed by adjoining first and second channel holes, which are separately formed in the first and second decks. The formation of the slit structure and the channel holes can further reduce the stress in the 3D memory device and allow structures (e.g., source contact structures and channel structures) of desirable stability to be formed.

Figure 1B:
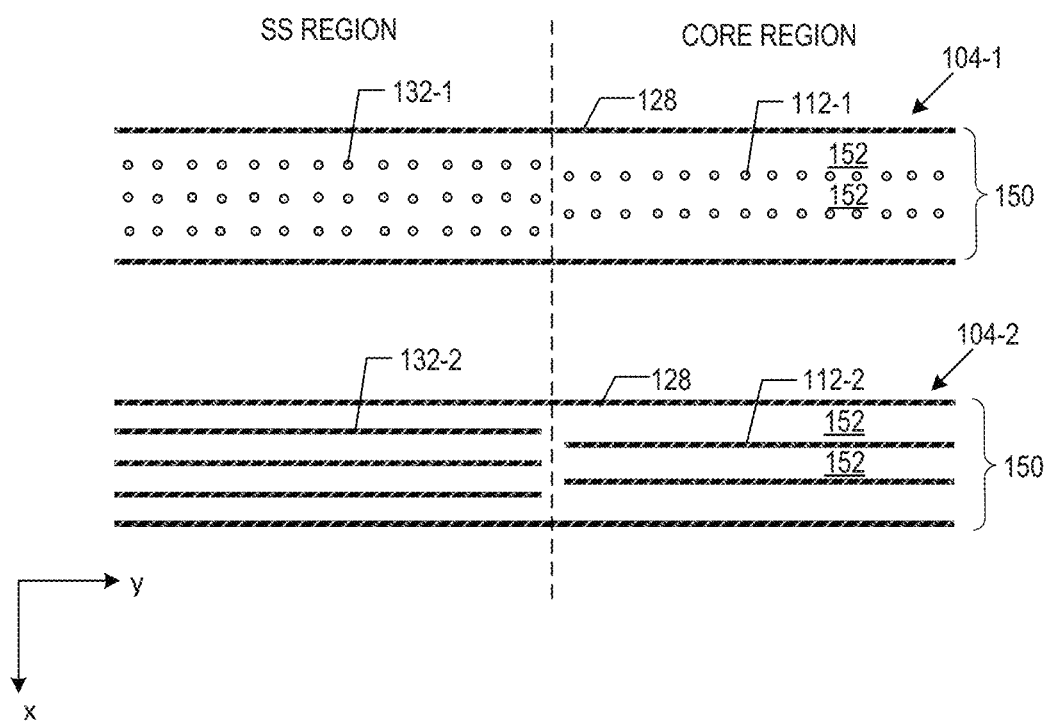
FIG. 1B illustrates a top view of the exemplary 3D memory device having adjoined source contact structures, according to some embodiments of the present disclosure.
Figure 1C:
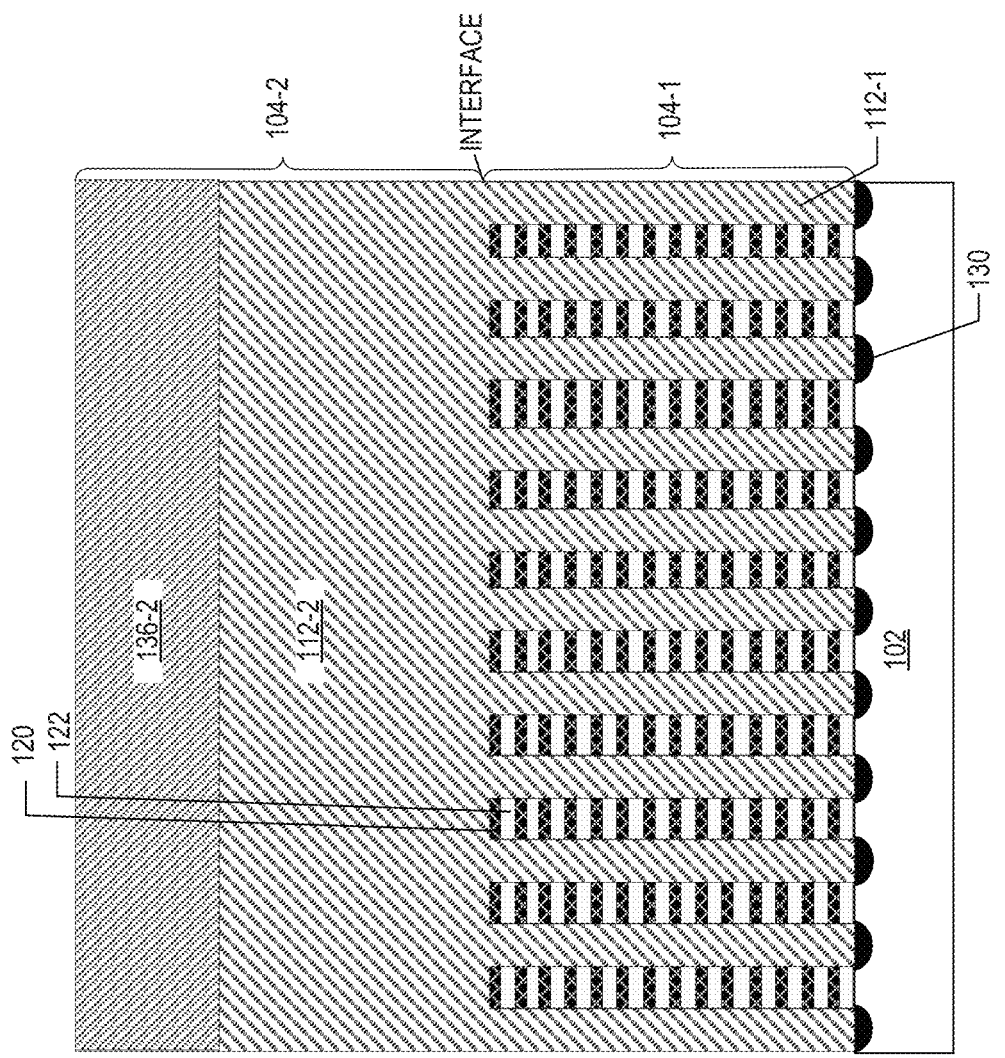
FIG. 1C illustrates a cross-sectional view of the exemplary 3D memory device having adjoined source contact structures along the A-A' direction, according to some embodiments of the present disclosure.
Figure 3A:
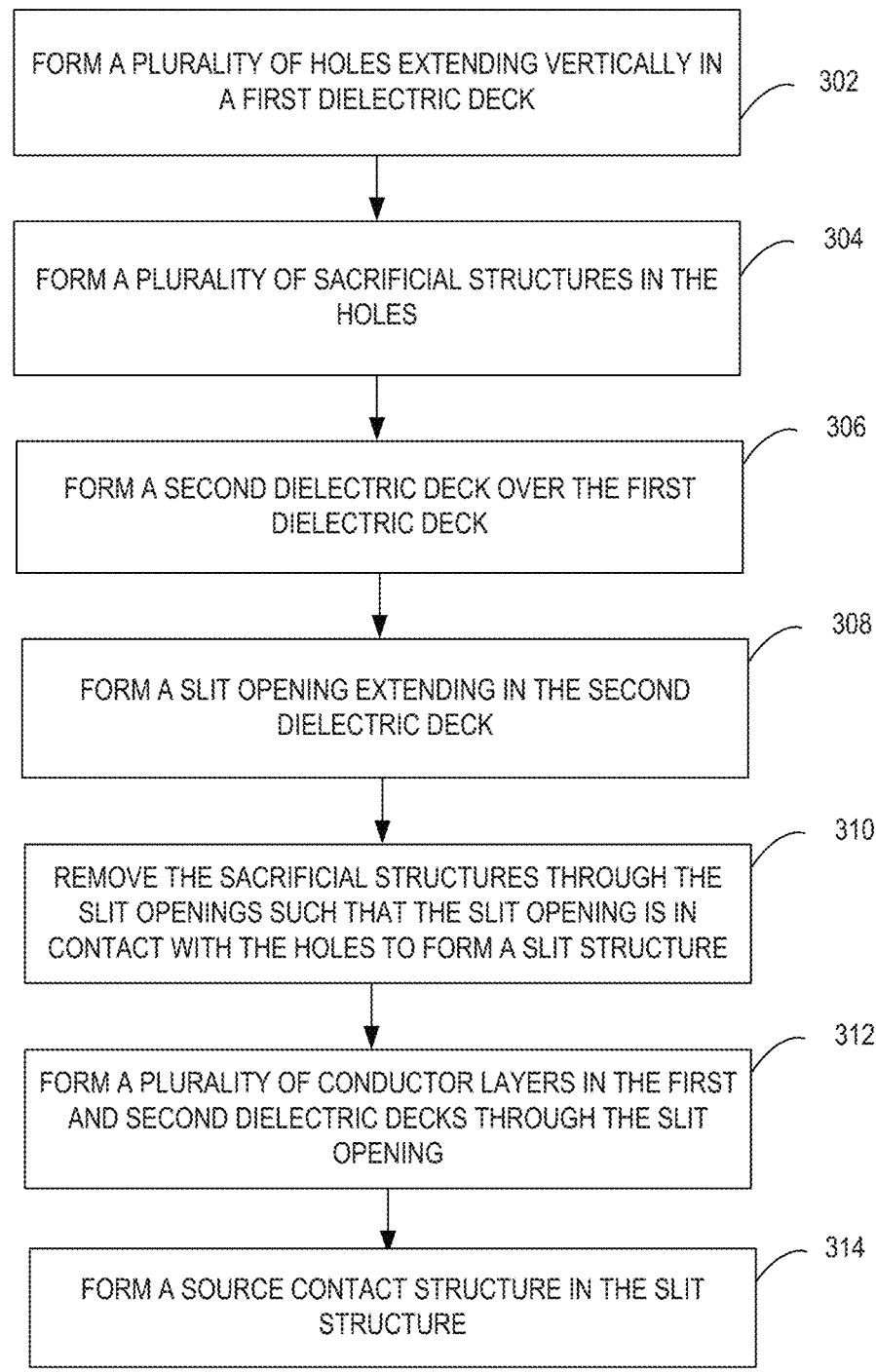
FIG. 3A illustrates a flowchart of an exemplary method for forming a 3D memory device having adjoined source contact structures, according to some embodiments of the present disclosure.
Figure 3B:
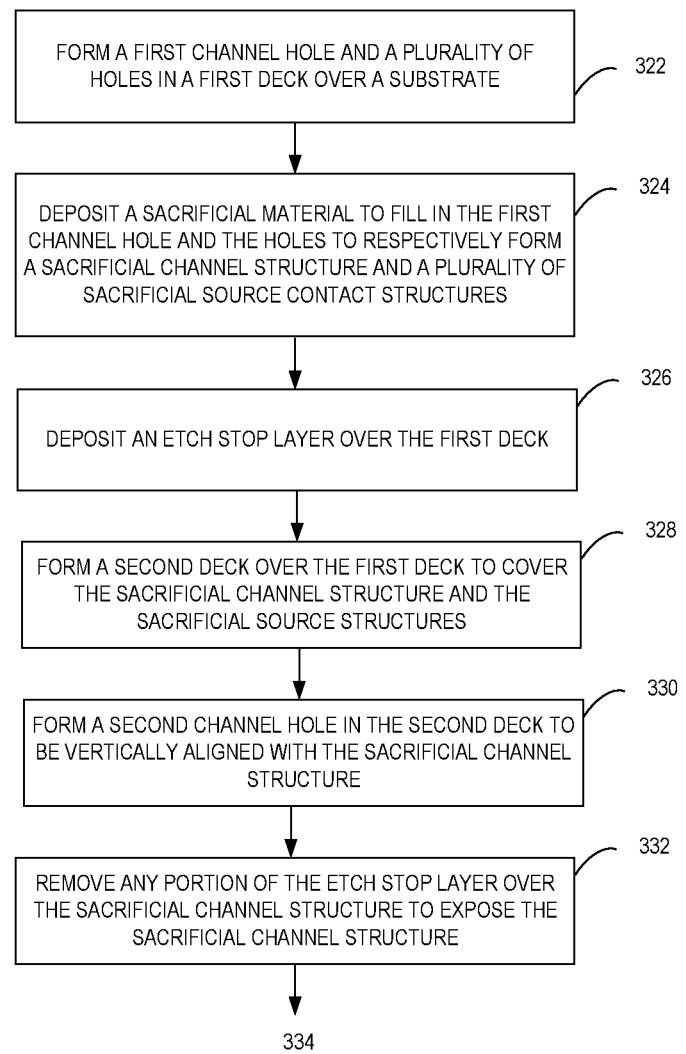
FIGS. 3B-3D illustrate a flowchart of exemplary detailed fabrication operations of the method in FIG. 3A, according to some embodiments of the present disclosure.
Figure 3C:
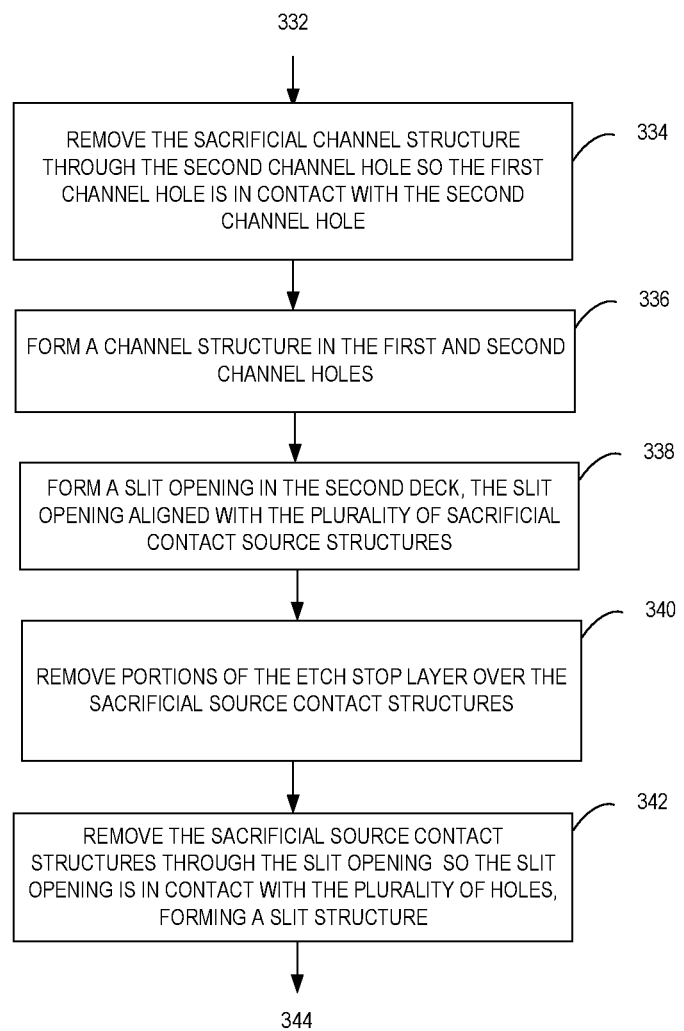
Figure 3D:
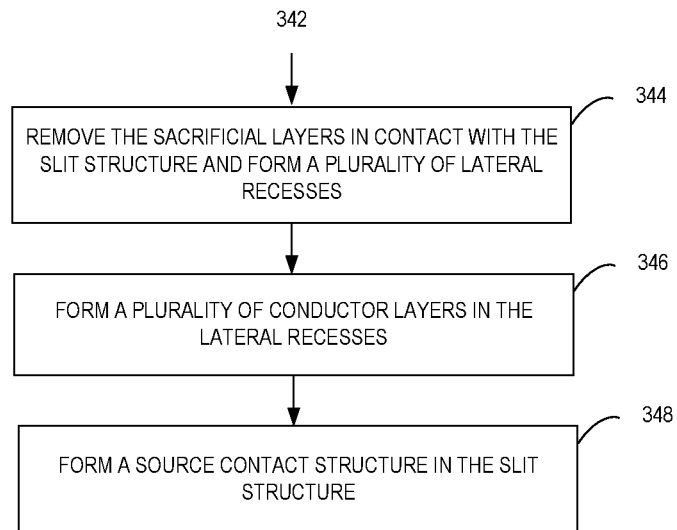

FIGS. 1A-1C illustrate views of an exemplary 3D memory device 100 having a dual-deck structure, according to some embodiments. Specifically, FIG. 1A illustrates a cross-sectional view of 3D memory device 100 in a core region along the x-z plane, FIG. 1B illustrates a top view of 3D memory device 100 in the core region and a staircase region along the x-y plane, and FIG. 3 illustrates a cross-sectional view of 3D memory device 100 in the core region and the staircase region along the A-A' direction (e.g., the y-z plane). As shown in FIG. 1A, 3D memory device 100 may include a substrate 102, a memory stack 104 over substrate 102, one or more channel structures 116 vertically extending in memory stack 104 (e.g., along the z-axis), and one or more source contact structures 106 extending in memory stack 104 vertically. Memory stack 104 may include a first memory deck 104-1 over substrate 102, and a second memory deck 104-2 over first memory deck 104-1. In some embodiments, 3D memory device 100 includes an etch stop layer 110 extending laterally at the interface of adjacent memory decks in 3D memory device 100. 3D memory device 100 may also include a dielectric cap layer 124 covering channel structures 116.

Substrate 102 can include silicon (e.g., single crystalline silicon), silicon germanium (SiGe), gallium arsenide (GaAs), germanium (Ge), silicon on insulator (SOD, germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Memory stack 104, e.g., each of first and second memory decks 104-1 and 104-2, may include a plurality of interleaved conductor layer 120 and dielectric layer 122. The intersection of channel structures 116 and conductor layers 120 may form a plurality of memory cells, e.g., an array of memory cells, in 3D memory device 100. The number of the conductor/dielectric layer pairs in memory stack 104 (e.g., 32, 64, 96, or 128) determines the number of memory cells in 3D memory device 100. Conductor layers 120 and dielectric layers 122 may alternate in the vertical direction (e.g., the z-direction). In other words, except for the ones at the top or bottom of memory stack 104, each conductor layer 120 can be adjoined by two dielectric layers 122 on both sides, and each dielectric layer 122 can be adjoined by two conductor layers 120 on both sides. Conductor layers 120 can each have the same thickness or have different thicknesses. Similarly, dielectric layers 122 can each have the same thickness or have different thicknesses. Conductor layers 120 can include conductor materials including, but not limited to, tungsten (W), cobalt (Co), copper (Cu), aluminum (Al), polycrystalline silicon (polysilicon), doped silicon, silicides, or any combination thereof. Dielectric layers 122 can include dielectric materials including, but not limited to, silicon oxide, silicon nitride, silicon oxynitride, or any combination thereof. In some embodiments, conductor layers 120 include metal layers, such as W, and dielectric layers 122 include silicon oxide.

Channel structures 116 may form an array and may each extend vertically above substrate 102. Channel structure 116 can include a semiconductor channel extending vertically through the alternating conductor/dielectric stack. Channel structure 116 can include a channel hole filled with a channel-forming structure of a plurality of channel-forming layers, e.g., dielectric materials (e.g., as a memory film) and/or semiconductor materials (e.g., as a semiconductor layer). In some embodiments, the memory film is a composite layer including a tunneling layer, a memory layer (also known as a "charge trap layer"), and a blocking layer. The remaining space of the channel hole can be partially or fully filled with a dielectric core including dielectric materials, such as silicon oxide. Channel structure 116 can have a cylindrical shape (e.g., a pillar shape) through memory stack 104, or have a trapezoid shape in each memory deck and a staggered portion at the interface between adjacent memory decks (e.g., between first memory deck 104-1 and second memory deck 104-2 and along the sidewall of channel structure 116). Channel structure 116 may also have any other suitable shapes, which are not limited by the embodiments of the present disclosure. The dielectric core, semiconductor layer, the tunneling layer, the memory layer, and the blocking layer are arranged radially from the center toward the sidewall in this order, according to some embodiments. The semiconductor layer can include silicon, such as amorphous silicon, polysilicon, and/or single crystalline silicon. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 116 further includes a conductive plug 126 (e.g., a semiconductor plug) in the lower portion (e.g., at the lower end of bottom) of channel structure 116. As used herein, the "upper end" of a component (e.g., channel structure 116) is the end farther away from substrate 102 in the vertical direction, and the "lower end" of the component (e.g., channel structure 116) is the end closer to substrate 102 in the vertical direction when substrate 102 is positioned in the lowest plane of 3D memory device 100. Conductive plug 126 can include a semiconductor material, such as silicon, which is epitaxially grown (e.g., using selective epitaxial growth) from substrate 102 or deposited onto substrate 102 in any suitable directions. It is understood that in some embodiments, conductive plug 126 includes single crystalline silicon, the same material as substrate 102. In other words, conductive plug 126 can include an epitaxially-grown semiconductor layer grown from substrate 102. Conductive plug 126 can also include a different material than substrate 102. In some embodiments, conductive plug 126 includes at least one of silicon, germanium, and silicon germanium. In some embodiments, part of conductive plug 126 is above the top surface of substrate 102 and in contact with the semiconductor channel. Conductive plug 126 may be conductively connected to the semiconductor channel. In some embodiments, a top surface of conductive plug 126 is located between a top surface and a bottom surface of a bottom dielectric layer 122 (e.g., the dielectric layer at the bottom of memory stack 104). In some embodiments, a bottom surface of conductive plug 126 is below the top surface of substrate 102. In some embodiments, the bottom surface of conductive plug 126 is in contact with the top surface of substrate 102.

In some embodiments, channel structure 116 further includes a drain structure 118 (e.g., channel plug) in the upper portion (e.g., at the upper end) of channel structure 116. Drain structure 118 can be in contact with the upper end of the semiconductor channel and may be conductively connected to the semiconductor channel. Drain structure 118 can include semiconductor materials (e.g., polysilicon) or conductive materials (e.g., metals). In some embodiments, drain structure 118 includes an opening filled with Ti/TiN or Ta/TaN as an adhesion layer and tungsten as a conductor material. By covering the upper end of the semiconductor channel during the fabrication of 3D memory device 100, drain structure 118 can function as an etch stop layer to prevent etching of dielectrics filled in the semiconductor channel, such as silicon oxide and silicon nitride. In subsequent operations, conductive structures such as vias and/or contact pads can be formed over drain structure 118.

In some embodiments, source contact structure 106 extends vertically through the memory stack 104 and is in contact with substrate 102. Source contact structure 106 may include an insulating spacer 114 and a source contact 112 in insulating spacer 114. A doped region 130 may be formed in substrate 102, in contact with and conductively connected to source contact 112. In some embodiments, insulating spacer 114 has multiple layers, e.g., a composite structure. For example, insulating spacer 114 may include a plurality of insulating layers (e.g., silicon oxide, silicon nitride, and/or silicon oxynitride) arranged radially towards the sidewall of source contact structure 106. A source voltage can be applied to the memory cells through doped region 130 and source contact 112. Source contact 112 may include a plurality of first source contact portions 112-1 each extending in first memory deck 104-1 and a second source contact portion 112-2 extending in second memory deck 104-2. Second source contact portion 112-2 may be vertically aligned with, in contact with, and conductively connected to first source contact portions 112-1 (e.g., along the z-direction) at the interface of first and second memory decks 104-1 and 104-2. In some embodiments, the cross-section of each source portion along the x-z plane may have a trapezoid shape, of which a lateral dimension may decrease towards substrate 102. In some embodiments, source contact 112 has a trapezoid shape or a pillar shape extending through memory stack 104.

Source contact structure 106 may have a staggered portion at the interface of first and second memory decks 104-1 and 104-2. The staggered portion may be along the sidewall of source contact structure 106. The staggered portion, formed by the difference in lateral dimensions of adjacent source portions, may include a lateral portion in contact with the ends of adjacent source portions. In some embodiments, insulating spacer 114 may include a suitable dielectric material such as silicon oxide. In some embodiments, source contact 112 may include a suitable conductive material such as one or more of tungsten, polysilicon, doped silicon, silicides, aluminum, copper, and cobalt. In some embodiments, first source contact portion 112-1 includes polysilicon and second source contact portion 112-2 includes polysilicon portion 136-1 and tungsten portion 136-2 over polysilicon portion 136-1. In some embodiments, first source contact portions 112-1 and second source contact portion 112-2 each includes tungsten. In some embodiments, first source contact portions 112-1 each includes polysilicon over tungsten and second source contact portion 112-2 includes tungsten. Doped region 130 may include suitable dopants with opposite polarity versus substrate 102.

In some embodiments, 3D memory device 100 includes an etch stop layer 110 at the interface of first and second memory decks 104-1 and 104-2. Etch stop layer 110 may include a plurality of portions distributed in the areas outside of source contact structures 106 and channel structures 116. Etch stop layer 110 may include a suitable material that has a high etching selectivity over dielectric layer 122. In some embodiments, etch stop layer 110 includes polysilicon.

FIG. 1B illustrates top views of source contact structures 106, each including a plurality of first source contact portions and a respective second source contact portion, extending along the same lateral direction (e.g., the y-axis) in the staircase region and the core region, according to some embodiments. Specifically, FIG. 1B illustrates the layouts of first and second source contact portions 112-1 and 112-2 in the core region ("CORE REGION"), and first and second source contact portions 132-1 and 132-2 in the staircase region ("SS REGION") in memory stack 104. Each second source contact portion 112-2 (e.g., extending continuously along the y-axis), may correspond to a plurality of first source contact portions 112-1 (e.g., distributed separately along the y-axis), and each second source contact portion 132-2 (e.g., extending continuously along the y-axis), may correspond to a plurality of first source contact portions 132-1 (e.g., distributed separately along the y-axis). Each second source contact portion (e.g., 112-2 and 132-2) and the corresponding first source contact portions (e.g., 112-1 and 132-1) may form a source contact (e.g., 112 and 132). As shown in FIG. 1B, source contact 112 (or source contact structure 106) may extend laterally (e.g., along the y-axis) in the core region, and source contact 132 may extend laterally (e.g., along the y-axis) in the staircase region. Along the y-axis, the length of each second source contact portion 112-2/132-2 may be equal to the distance along which the respective first source contact portions 112-1/132-1 extend. In the core region, each source contact structure 106 (or source contact 112) may be located in a memory block 150 to divide memory cells in the memory block into a pair of fingers 152. That is, each source contact structure 106 may be located between adjacent fingers 152 in a memory block. In some embodiments, source contact structures 106 in the staircase region and the core region are not in contact with one another. That is, in some embodiments, a single source contact structure 106 only extends in one of the staircase region and the core region. In some embodiments, the shapes, dimensions, and compositions of source contacts 132 and 112 may be the same or similar.

FIG. 1B also illustrates a pair of second source contact structures 128 (not shown in FIGS. 1A and 1C) positioned between memory blocks. That is, second source contact structures 128 may divide memory cells in memory stack 104 into a plurality of memory blocks, in which one or more source contact structures 106 may be located. Different from source contact structures 106, each second source contact structure 128 may extend continuously along the z-axis in the first and second memory decks 104-1 and 104-2, e.g., completely separating memory cells in adjacent memory blocks. In some embodiments, second source contact structures 128 may extend continuously in the staircase region and the core region along the y-axis. That is, in some embodiments, a single second source contact structure 128 can extend in both of the staircase region and the core region.

Along the x-y plane (e.g., the lateral plane), the cross-section of first source contact portion 112-1 may be any suitable shape such as a circular shape (as shown in FIG. 1B), a stripe shape, a elliptic shape, a squared shape, and/or other shapes. In some embodiments, the cross-section of second source contact portion 112-2 is a stripe shape that has a length (e.g., along the y-axis) greater than a width (e.g., along the x-axis). In various embodiments, cross-sections of second source contact portions 112-2 include one or more shapes such as rectangular shape. The shape, number, ratio, and distribution of structures in the figures of the present disclosure are merely for illustrative purposes and do not indicate the actual shape, number, ratio, and distribution of structures.

In various embodiments, channel structures 116 in the staircase region and the core region can be the same or different. In some embodiments, source contact structures 106 in the staircase region and the core region can be the same or different. The specific structures of channel structures 116 and source contact structures 106 should not be limited by the embodiments of the present disclosure.

FIG. 1C illustrates a cross-sectional view of source contact 112 along the A-A' direction, e.g., along the y-z plane, according to some embodiments. As shown in FIG. 1C, first source contact portions 112-1 may be separately distributed along the y-axis and aligned with second source contact portion 112-2 vertically. First source contact portions 112-1 may be in contact with and conductively connected to second source contact portion 112-2 at the interface of first and second memory decks 104-1 and 104-2. As an example, first source contact portions 112-1 each includes polysilicon and second source contact portion 112-2 includes a polysilicon portion 136-1 and a tungsten portion 136-2 over polysilicon portion 136-1. First source contact portions 112-1 may include any suitable shapes, e.g., each having the same shape as one another or a different shape from one another. For example, first source contact portions 112-1 may have a pillar shape and/or a trapezoid shape. In some embodiment, first source contact portions 112-1 are evenly spaced along the y-axis and has the same shape and dimensions as each other. In some embodiments, each first source contact portions 112-1 has the same cylindrical shape and the same height along the z-axis. In some embodiments, second source contact portion 112-1 extends continuously along the y-axis and the z-axis (or along the y-z plane) in second memory deck 104-2. In some embodiments, second source contact portion 112-1 has a cuboid shape. The lateral dimension of second source contact portion 112-2 along the x-axis may be less than, greater than, or nominally the same as the lateral dimensions of first source contact portions 112-1 along the x-axis. In some embodiments, along the x-axis, the lateral dimension of second source contact portion 112-2 is less than the lateral dimension of first source contact portions 112-1 at the interface, as shown in FIG. 1A.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 2A:
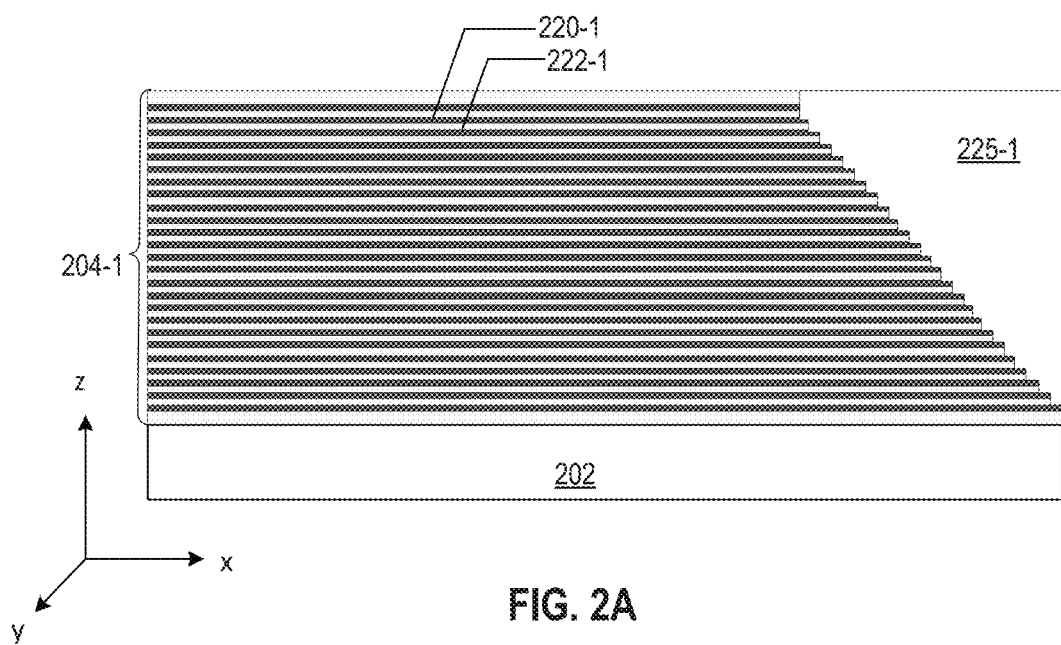
FIGS. 2A-2H illustrate cross-sectional views of a 3D memory device having adjoined source contact structures at various stages of an exemplary fabrication process, according to some embodiments of the present disclosure.
Figure 2B:
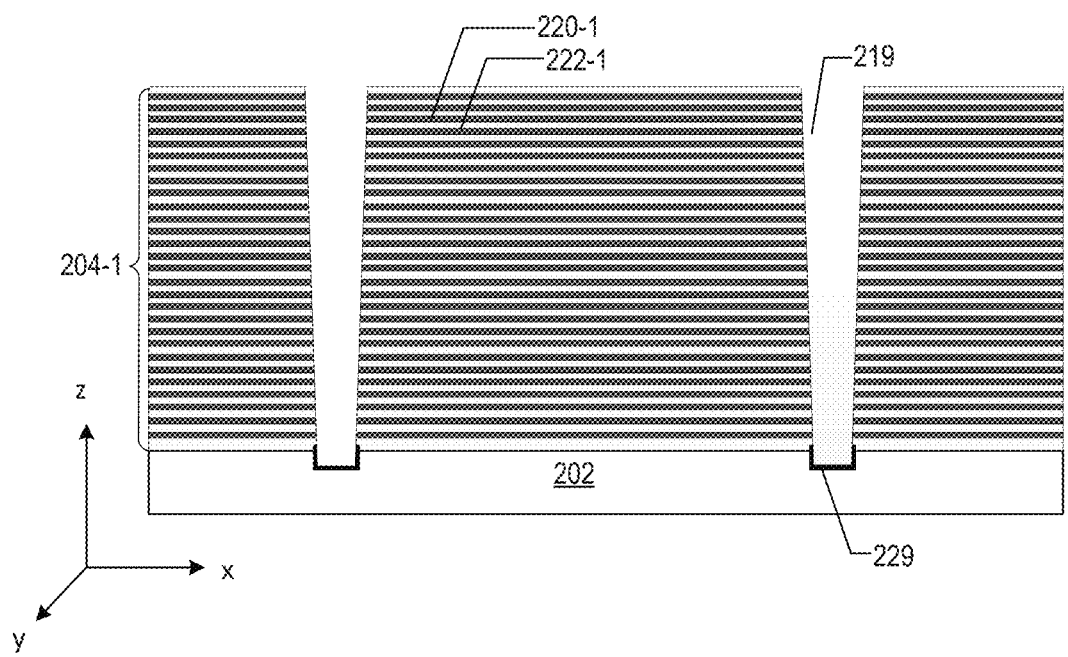
Figure 2C:
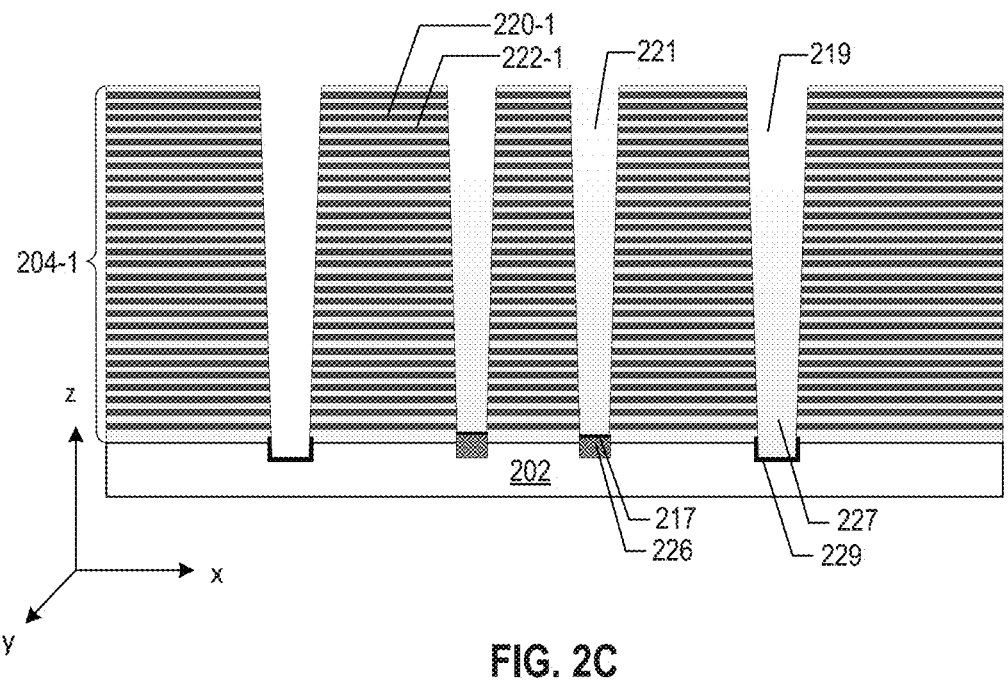
Figure 2D:
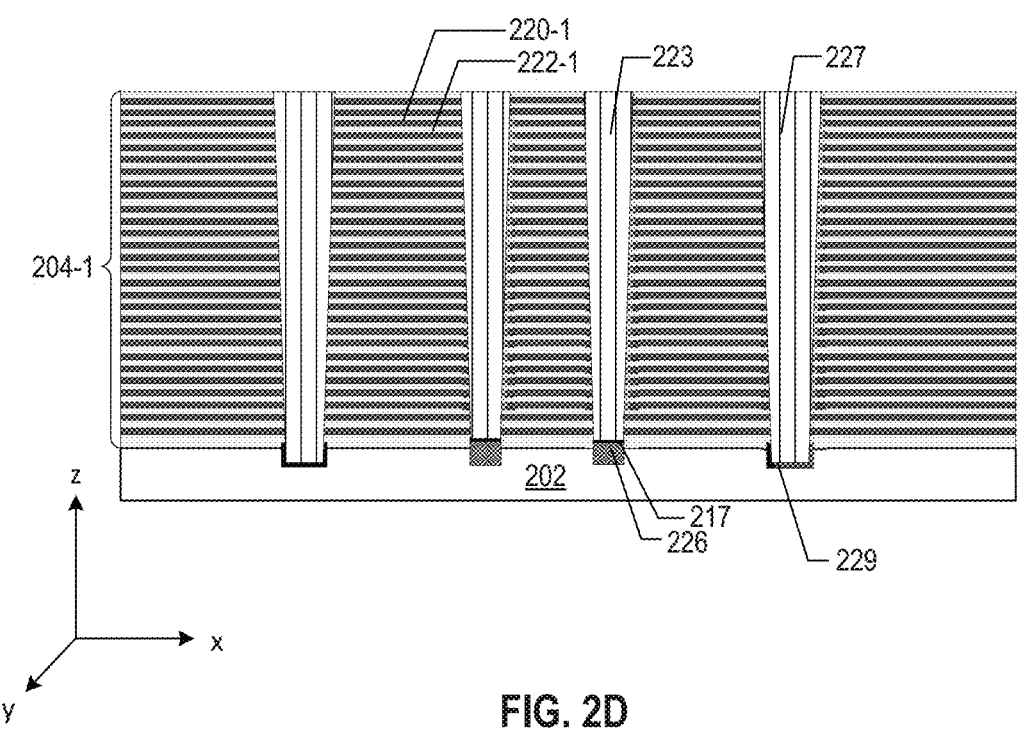
Figure 2E:
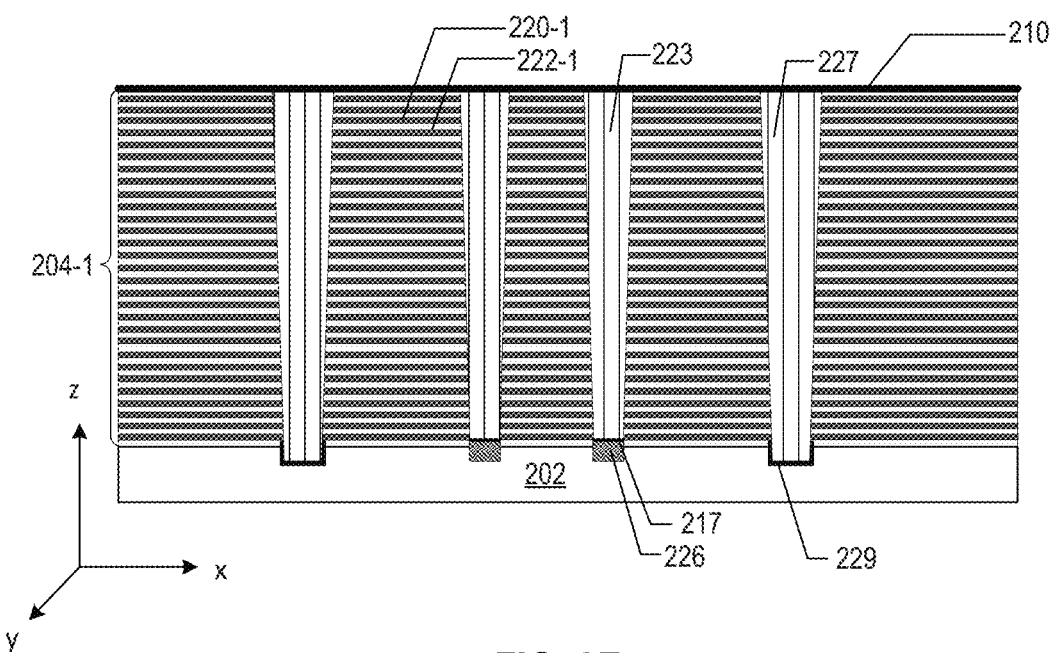
Figure 2F:
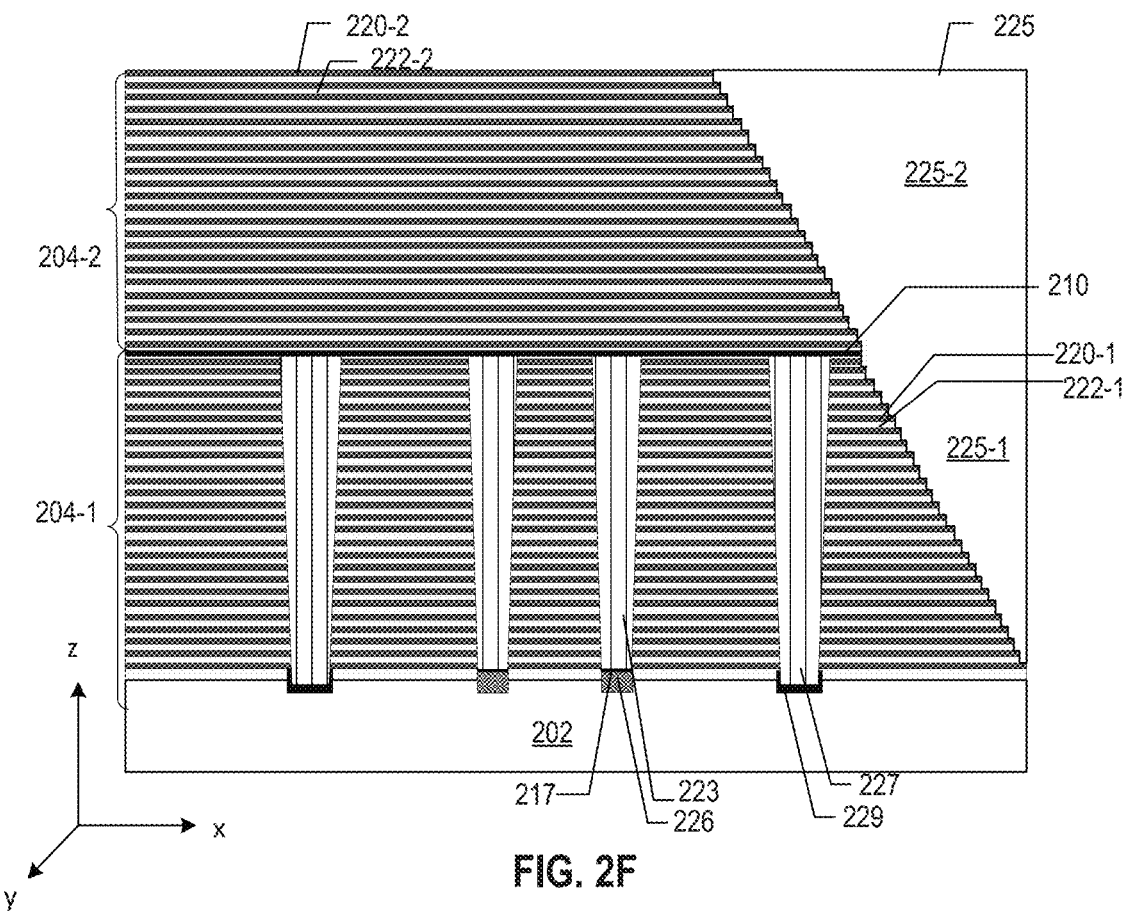
Figure 2G:
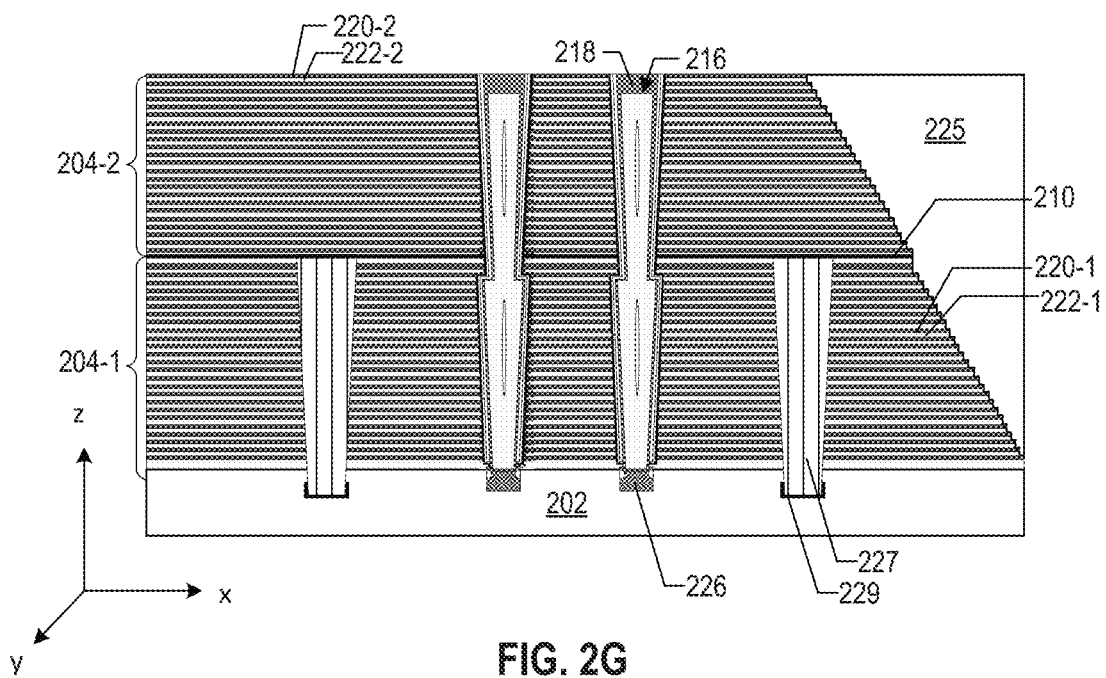
Figure 2H:
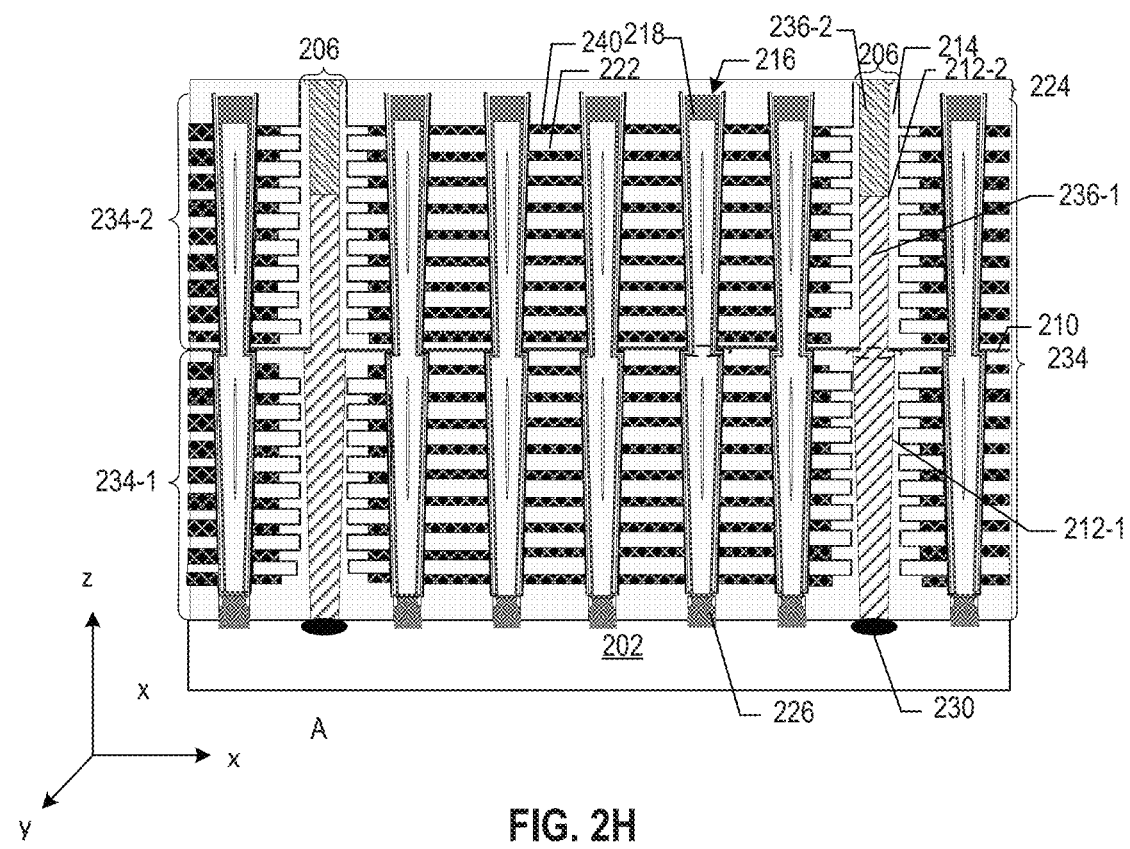

FIGS. 2A-2H illustrate cross-sectional views of 3D memory device 100 at various stages of a fabrication process, according to some embodiments. FIG. 3A illustrates a flowchart of a method 300 to form 3D memory device 100. FIGS. 3B-3D illustrate a flowchart showing detailed fabrication operations of method 300. For ease of illustration, the fabrication process of 3D memory device 100 having a dual-deck structure is described. In various embodiments, a 3D memory device may also have more than two memory decks along the vertical direction (e.g., the z-direction). For example, each of first and second source contact portions may vertically extend in one or more memory decks and be adjoined at interfaces of adjacent memory decks. The fabrication of structures in a 3D memory device with more than two memory decks can be similar to the fabrication of 3D memory device 100 and is not described herein. It is understood that the operations shown in method 300 are not exhaustive and that other operations can be performed as well before, after, or between any of the illustrated operations. Further, some of the operations may be performed simultaneously, or in a different order than shown in FIGS. 2A-2H and 3A-3D.

As shown in FIG. 3A, method 300 includes Operations 302-314. In Operation 302, a plurality of holes are formed extending vertically in a first dielectric deck that has interleaved a plurality of first sacrificial layers and a plurality of first dielectric layers over a substrate. In Operation 304, a plurality of sacrificial structures are formed in the holes. In Operation 306, a second dielectric deck is formed. The second dielectric deck may include interleaved a plurality of second sacrificial layers and a plurality of second dielectric layers over the first dielectric deck. In Operation 308, a slit opening is formed extending in the second dielectric deck. The slit opening may be aligned with and over the sacrificial source contact structures. In Operation 310, the sacrificial structures are removed through the slit openings such that the slit opening is in contact with the holes to form a slit structure. In Operation 312, a plurality of conductor layers are formed in the first and second dielectric decks through the slit structure, forming a memory stack. In Operation 314, a source contact structure is formed in the slit structure. The details of Operations 302-314 are described below.

At the beginning of the process, a first channel hole and a plurality of holes are formed in a first deck over a substrate (Operation 322). FIGS. 2A-2C illustrate corresponding structures.

As shown in FIG. 2A, in some embodiments, a first insulating portion 225-1 is formed to surround first dielectric deck 204-1 such that first deck 204-1 is in first insulating portion 225-1. First dielectric deck 204-1 may have a staircase structure, e.g., in the staircase region of first dielectric deck 204-1. The staircase structure can be formed by repetitively etching the plurality of interleaved first sacrificial layers 220-1 and first dielectric layers 222-1 using an etch mask, e.g., a patterned PR layer over first dielectric deck 204-1. Each first sacrificial layer 220-1 and the underlying first sacrificial layer 222-1 may be referred to as a dielectric pair. In some embodiments, one or more dielectric pairs can form one level/stair. During the formation of the staircase structure, the PR layer is trimmed (e.g., etched incrementally and inwardly from the boundary of the memory stack, often from all directions) and used as the etch mask for etching the exposed portion of first dielectric deck 204-1. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the first sacrificial layer 220-1 and the underlying first dielectric layer 222-1. The etched first sacrificial layers 220-1 and first dielectric layers 222-1 may form stairs in first dielectric deck 204-1. The PR layer can then be removed. In some embodiments, first insulating portion 225-1 is deposited to surround first dielectric deck 104-1 such that first dielectric deck 104-1 is in first insulating portion 225-1. First insulating portion 225-1 may include any suitable insulating material such as silicon oxide, and may be deposited by a suitable deposition process such as CVD, PVD, and/or ALD, For illustrative purposes, the formation of the source contact structures in the core region is described and depicted. In some embodiments, the source contact structures in the staircase region and in the core region are formed by the same operations. As shown in FIG. 2C, one or more first channel holes 221 and a plurality of holes 219 are formed extending in a first dielectric deck 204-1 over a substrate 202. The plurality of holes 219 may be formed to align along a lateral direction, e.g., along the y-axis, such as the distribution of first source contact portions 112-1 described in FIGS. 1A-1C. In some embodiments, a conductive plug 226 is formed at the bottom portion of first channel hole 221.

A first dielectric deck 204-1, over a substrate 202, may be provided. As shown in FIG. 2A, first dielectric deck 204-1 may be formed over substrate 202 by alternatingly depositing first sacrificial layers 220-1 and first dielectric layers 222-1 over substrate 202. First sacrificial layers 220-1 and first dielectric layers 222-1 may have different etching selectivities during the subsequent gate-replacement process. In some embodiments, first sacrificial layers 220-1 and first dielectric layers 222-1 include different materials. In some embodiments, first sacrificial layers 220-1 include silicon nitride and first dielectric layers 222-1 include silicon oxide. The deposition of first sacrificial layers 220-1 and first dielectric layers 222-1 may each include one or more of chemical vapor deposition (CVD), physical vapor deposition (PVD), and atomic layered deposition (ALD).

A first channel hole 221 and a plurality of holes 219 may be formed extending in first dielectric deck 204-1, e.g., in any suitable order. That is, first channel hole 221 may be formed before, at the same time as, or after the formation of holes 219. In some embodiments, as shown in FIGS. 2B and 2C, holes 219 are formed before the formation of first channel hole 221. Holes 219 may each expose substrate 202 at the respective bottom portion. In some embodiments, an insulator layer 229, such as an oxide layer, may be formed at the bottom of each hole 219 to cover the portion of substrate 202 exposed at the bottom portion of the respective hole 219, e.g., to prevent damages to substrate 202 in subsequent operations such as the formation of conductive plug 226 at the bottom of a first channel hole. Insulator layer 229 may include a native oxide, e.g., silicon oxide, of substrate 202 and may be formed by any suitable oxidation process such as thermal oxidation. In some embodiments, insulator layer 229 is formed before the formation of the first channel holes 221.

In some embodiments, first channel holes 221 and holes 219 are formed by the same patterning/etching process. In some embodiments, first channel hole 221 may be formed before the formation of holes 219, e.g., by a different patterning/etching process. Along the z-axis, first channel holes 221 and holes 219 may have the same depth or different depths. In these two scenarios, insulator layer 229 may be formed at the bottom portion of each hole 219 before the formation of conductive plug 226 at the bottom portion of first channel hole 221. In various embodiments, the formation of first channel hole 221 and holes 219 include an anisotropic etching process such as dry etch and/or an isotropic etching process such as wet etch, using an etch mask over first dielectric deck 204-1 such as a pattern photoresist layer.

To form conductive plug 226, a recess region may first be formed at the bottom of first channel hole 221 to expose a top portion of substrate 202 by the same etching process that forms first channel hole 221 above substrate 202 and/or by a separate recess etching process. In some embodiments, conductive plug 226 is formed at the bottom of first channel hole 221, e.g., over the recess region. Conductive plug 226 may be formed by an epitaxial growth process and/or a deposition process and may include a semiconductor material. In some embodiments, conductive plug 226 is formed by epitaxial growth (e.g., selective epitaxial growth) and is referred to as an epitaxial portion. Optionally, a recess etch (e.g., dry etch and/or wet etch) may be performed to remove excess semiconductor material on the sidewall of the channel hole and/or control the top surface of conductive plug 226 at a desired position. In some embodiments, conductive plug 226 includes single crystalline silicon and is formed by epitaxially grown from substrate 202. In some embodiments, conductive plug 226 includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

Optionally, another oxide layer 217 may be formed over conductive plug 226 to prevent damages to conductive plug 226 in subsequent operations such as the formation of a respective sacrificial channel structure.

Referring back to FIG. 3A, after the formation of the first channel hole and the holes, method 300 proceeds to operation 324, in which a sacrificial material is deposited to fill in the first channel hole and the holes to respectively form a sacrificial channel structure and a plurality of sacrificial source contact structures. FIG. 2D illustrates a corresponding structure.

As shown in FIG. 2D, a sacrificial material can be deposited to fill in first channel hole 221 and holes 219 to respective form a sacrificial channel structure 223 in first channel hole 221 and sacrificial source contact structures 227 in holes 219. In some embodiments, sacrificial channel structures 223 may each be over respective oxide layer 217, and sacrificial source contact structure 227 may each be over the respective insulator layer 229. The sacrificial material may include any suitable material that has sufficient stiffness and strength to support first dielectric deck 204-1 in subsequent operations such as the deposition of a second dielectric deck. In some embodiments, the sacrificial material includes, but not limited to, polysilicon, silicon carbide, and/or carbon. For example, the sacrificial material can include polysilicon and can be deposited using a suitable deposition process such as one or more of CVD, PVD, and ALD. Optionally, a planarization process, e.g., dry/wet etch and/or CMP, is performed to remove any excess sacrificial material on the top surface of first dielectric deck 204-1.

Referring back to FIG. 3A, after the formation of the sacrificial channel structure and sacrificial source contact structures, method 300 proceeds to operation 326, in which an etch stop layer is formed over the first dielectric deck. FIG. 2E illustrates a corresponding structure.

As shown in FIG. 2E, an etch stop layer 210 is formed over first dielectric deck 204-1. Etch stop layer 210 may cover at least portions/areas of first dielectric deck 204-1 between adjacent sacrificial source contact structures 227. Etch stop layer 210 may prevent the portions/areas of first dielectric deck 204-1 between adjacent sacrificial source contact structures 227 from being etched during the formation of a hole, which extends continuously along the lateral direction that sacrificial source contact structures 227 extend along. In some embodiments, etch stop layer 210 covers first dielectric deck 204-1. Etch stop layer 210 may include any suitable material(s) that has a different etching selectivity than the materials of first dielectric deck 204-1. In some embodiments, first sacrificial layers 220-1 include silicon nitride, first dielectric layers 222-1 include silicon oxide, and etch stop layer 210 includes polysilicon. The thickness of etch stop layer 210 may be sufficient to prevent the etchant, in the formation of the slit opening, from continuously etching vertically beyond etch stop layer 210. In some embodiments, etch stop layer 210 is formed using a suitable deposition process such as one or more of CVD, PVD, and ALD.

Referring back to FIG. 3A, after the formation of the etch stop layer, method 300 proceeds to operation 328, in which a second dielectric deck is formed over the first dielectric deck to cover the sacrificial channel structure and the sacrificial source structures. FIG. 2F illustrates a corresponding structure.

As shown in FIG. 2F, a second dielectric deck 204-2 may be formed over first dielectric deck 204-1, covering sacrificial channel structure 223, sacrificial source contact structures 227, and etch stop layer 210. Second dielectric deck 204-2 may include interleaved a plurality of second sacrificial layers 220-2 and second dielectric layers 222-2. In some embodiments, second dielectric deck 204-2 has a staircase structure, in a staircase region of second dielectric deck 204-2. In some embodiments, a second insulating portion 225-2, e.g., including silicon oxide, is formed to surround second dielectric deck 204-2 and over first insulating portion 225-1 such that second dielectric deck 204-2 is in second insulating portion 225-2. Second insulating portion 225-2 and first insulating portion 225-1 may form an insulating structure 225 in which first and second dielectric decks 204-1 and 204-2 are located. The formation of second dielectric deck 204-2 may be similar to the formation of first dielectric deck 204-1, and the formation of second insulating portion 225-1 may be similar to the formation of first insulating portion 225-1, and the detailed descriptions of both are not repeated herein.

Referring back to FIGS. 3A-3D, after the formation of the second dielectric deck, method 300 proceeds to operations 330, in which a second channel hole is formed in the second dielectric deck to be vertically aligned with the sacrificial channel structure, and any portion of the etch stop layer over the sacrificial channel structure and exposed at the bottom of the second channel hole is removed to expose the sacrificial channel structure. Further, the sacrificial channel structure is removed through the second channel hole so the first channel hole is in contact with the second channel hole, and a channel structure is formed in the first and second channel holes. FIG. 2G illustrates a corresponding structure.

As shown in FIG. 2G, a channel structure 216 may be formed extending in first and second dielectric decks 204-1 and 204-2. In some embodiments, according to operation 310, a second channel hole is formed in second dielectric deck 204-1 to extend and be vertically aligned with sacrificial channel structure 223. The bottom portion of the second channel hole may expose a portion of etch stop layer 210 over sacrificial channel structure 223. To form the second channel hole, second dielectric deck 204-2 may be etched until etch stop layer 210 is exposed at the bottom portion of the second channel hole. The etching process to form the second channel hole may be similar to the etching process to form first channel hole 221, and the detailed description is not repeated herein.

According to operation 310, any portion of etch stop layer 210 over sacrificial channel structure 223, exposed at the bottom portion of the second channel hole, may be removed. Sacrificial channel structure 223 may be exposed, e.g., at the bottom portion of the second channel hole. A suitable etching process, e.g., dry etch and/or wet etch, can be performed to remove the portion of etch stop layer 210. Sacrificial channel structure 223 may further be removed, according to operation 334, using a suitable etching process, e.g., dry etch and/or wet etch. The second channel hole and first channel hole 221 may thus be in contact with each other, e.g., at the interface of first and second dielectric decks 204-1 and 204-2, to form a channel hole. In some embodiments, oxide layer 217 may be fully or partially removed to expose conductive plug 226 so that the subsequently formed semiconductor layer, in which a semiconductor channel is formed, can be in contact with conductive plug 226. Insulator layer 217 may be removed by the same etching process that removes sacrificial channel structure 223 or a different etching process, e.g., dry etch and/or wet etch. In some embodiments, the second channel hole may have a trapezoid shape and a lateral dimension of second channel hole may be less than the lateral dimension of first channel hole 221 at the interface. Thus, in some embodiments, the sidewall of the channel hole may have a staggered profile at the interface.

A channel structure may then be formed in the channel hole, according to operation 336. In some embodiments, a memory film, a semiconductor layer, and a dielectric core are deposited in the channel hole. Specifically, the memory film may include a blocking layer, a memory layer, and a tunneling layer. In some embodiments, the dielectric core, semiconductor layer, the tunneling layer, the memory layer, and the blocking layer are arranged radially from the center toward the sidewall of the channel hole in this order. In some embodiments, the semiconductor layer is in contact with conductive plug 226 and a semiconductor channel is formed in the semiconductor layer. In some embodiments, the blocking layer, the memory layer, the tunneling layer the semiconductor layer, and the dielectric core can be sequentially deposited in this order using one or more thin film deposition processes, such as ALD, CVD, PVD, any other suitable processes, or any combination thereof.

In some embodiments, a drain structure 218 is formed in the upper portion of the channel hole. In some embodiments, parts of the memory film, semiconductor layer, and dielectric core in the upper portion of the channel hole can be removed by CMP, grinding, wet etching, and/or dry etching to form a recess in the upper portion of the channel hole so that a top surface of semiconductor channel may be located at a desired position in the channel hole. Drain structure 218 then can be formed by depositing conductive materials, such as metals and/or silicon, into the recess by one or more thin film deposition processes, such as CVD, PVD, ALD, electroplating, electroless plating, or any combination thereof. Channel structure 216 is thereby formed. Optionally, a planarization process, e.g., dry/wet etch and/or CMP, is performed to remove any excess material on the top surface of second dielectric deck 204-2. Optionally, a dielectric cap layer 224 is formed over second dielectric deck 204-2 to cover at least drain structure 218. In some embodiments, dielectric cap layer 224 includes silicon oxide, and is deposited by any suitable deposition process such as CVD, PVD, and/or ALD.

After the channel structures are formed, method 300 proceeds to operations 338, in which a slit opening is formed in the second dielectric deck aligned with the sacrificial source contact structures and portions of the etch stop layer over the sacrificial source contact structures are removed. The sacrificial source contact structures ae removed through the slit opening so the slit opening is in contact with the holes, forming a slit structure. Further, the sacrificial layers in contact with the slit structure are removed to form a plurality of lateral recesses, and a plurality of conductor layers are formed in the lateral recesses. A source contact structure is then formed in the slit structure. FIG. 2H illustrates a corresponding structure.

As shown in FIG. 2H, a slit opening is formed in second dielectric deck 204-2. The slit opening, having a cuboid shape and extending continuously in second dielectric deck 204-2, may be aligned with sacrificial contact source structures 227. In some embodiments, the slit opening extends vertically in second dielectric deck 204-2 and laterally along the lateral direction (e.g., the y-axis) sacrificial source contact structures 227 extend. The slit opening may be sufficiently wide (e.g., along the x-axis) so the slit opening at least partially overlaps with each of sacrificial source contact structures 227. In various embodiments, along the x-axis, the width of the slit opening may be greater than, less than, or at least nominally the same as the widths of sacrificial source contact structures 227. In some embodiments, along the x-axis, the width of the slit opening may be less than the widths of sacrificial source contact structures 227. In some embodiments, along the y-axis, a length of the slit opening is equal to a total distance in which sacrificial source contact structures 227 extend.

In some embodiments, using an etch mask, a suitable patterning/etching process, e.g., dry etch and/or wet etch, is performed to remove a portion of second dielectric deck 204-2 and form the slit opening. The etching second dielectric deck 204-2 may stop on etch stop layer 210, and portions of etch stop layer 210, e.g., the portions over sacrificial source contact structures 227 and the areas between adjacent sacrificial source contact structures 227, may be exposed at the bottom portion of the slit opening.

Further, the portions of etch stop layer 210 exposed at the bottom portion of slit opening may be removed to expose sacrificial source contact structures 227, according to operation 340. The removal of portions of etch stop layer 210 may include a suitable etching process such as dry etch and/or wet etch, similar to the etching of etch stop layer 210 in the formation of the channel hole. Sacrificial source contact structures 227 may then be removed through the slit opening, according to operation 342, using a suitable etching process such as dry etch and/or wet etch. In various embodiments, oxide layer 229 may or may not be removed. The slit opening and holes 219 may be adjoined or in contact with one another at the interface of first and second dielectric decks 204-1 and 204-2, forming a slit structure. In some embodiments, holes 219 each has a cylindrical shape (or a trapezoid shape), the slit opening has a cuboid shape, and the width of the slit opening is less than the width of hole 219 along the x-axis. A staggered profile may be formed on the sidewall of the slit structure at the interface of first and second dielectric decks 204-1 and 204-2.

Further, according to operation 344, the sacrificial layers in contact with the slit structure, including first sacrificial layers 220-1 in first dielectric deck 204-1 and second sacrificial layers 220-2 in second dielectric deck 204-2, may be removed through the slit structure. The removal of the sacrificial layers may include an isotropic etching process, e.g., wet etch. A plurality of lateral recesses may be formed in first and second dielectric decks 204-1 and 204-2. Further, according to operation 346, a conductor material may then be deposited to fill in the lateral recesses, forming a plurality of conductor layers 240 in first and second dielectric decks 204-1 and 204-2. In some embodiments, the conductor material is deposited by at least one of CVD, PVD, and ALD. First dielectric layers 222-1 and second dielectric layers 222-2 may be referred to as dielectric layers 222. Conductor layers 240 and dielectric layers 222 may be arranged alternatingly along the z-axis above substrate 202, and first and second dielectric decks 204-1 and 204-2 may respectively be referred to as first and second memory decks 234-1 and 234-2, form a memory stack 234.

Further, source contact structure 206, e.g., an adjoined source contact structure, may be formed in the slit structure, according to operation 348. In some embodiments, a doped region 230 is formed in substrate 202 at the bottom portion of the slit structure, e.g., using a suitable doping process such as ion implantation. In some embodiments, an insulating material, such as silicon oxide, is deposited over the sidewall of the slit structure, forming an insulating spacer 214. Optionally, a suitable recess etching process, e.g., dry etch and/or wet etch, may be performed to remove any excess portion of the insulating material and/or oxide layer 229 and expose substrate 202. A conductive material may be deposited to fill in the slit structure, forming a source contact 212. In some embodiments, source contact 212 may include more than one conductive material. For example, polysilicon may be deposited to fill in holes 219 and a lower portion of the slit opening, and tungsten may be deposited to fill in the rest of the slit opening. For ease of description, first source contact portions 212-1 (e.g., including polysilicon) may be formed in holes 219, and a second source contact portion 212-2 (e.g., including a polysilicon portion 236-1 and a tungsten portion 236-2 over polysilicon portion 236-1) may be formed in the slit opening. First source contact portions 212-1 and second source contact portion 212-2 may be adjoined at the interface of first and second memory decks 234-1 and 234-2 to form source contact 212, an adjoined source contact. Insulating spacer 214 may be deposited by one or more of CVD, PVD, and ALD, and source contact 212 may be deposited by one or more of CVD, PVD, ALD, and electroplating. Optionally, a planarization process, e.g., CMP and/or recess etch, is performed to remove any excess material (e.g., the materials for forming source contact structure 206) over memory stack 204. In some embodiments, first source contact portions 212-1 and second source contact portion 212-2 each includes tungsten. In some embodiments, first source contact portions 212-1 each includes polysilicon over tungsten and second source contact portion 212-2 includes tungsten.

It should be noted that, the staircase structures in first and second dielectric decks 204-1 and 204-2 can be formed by separately etching each dielectric deck 204-1/204-2 (e.g., the etching of the two dielectric decks are separated by other fabrication processes such as the formation of other structures, as described in FIG. 2) or etching first and second dielectric decks 204-1 and 204-2 in one etching process. The formation of the staircase structures may each occur in any suitable stage of the fabrication process. The specific order/timing to form the staircase structure should not be limited by the embodiments of the present disclosure. In some embodiments, insulating structure 225 is formed after the formation of the staircase structures in first and second dielectric decks 204-1 and 204-2, e.g., by a suitable deposition process such as CVD, PVD, and/or ALD.

Figure 4:
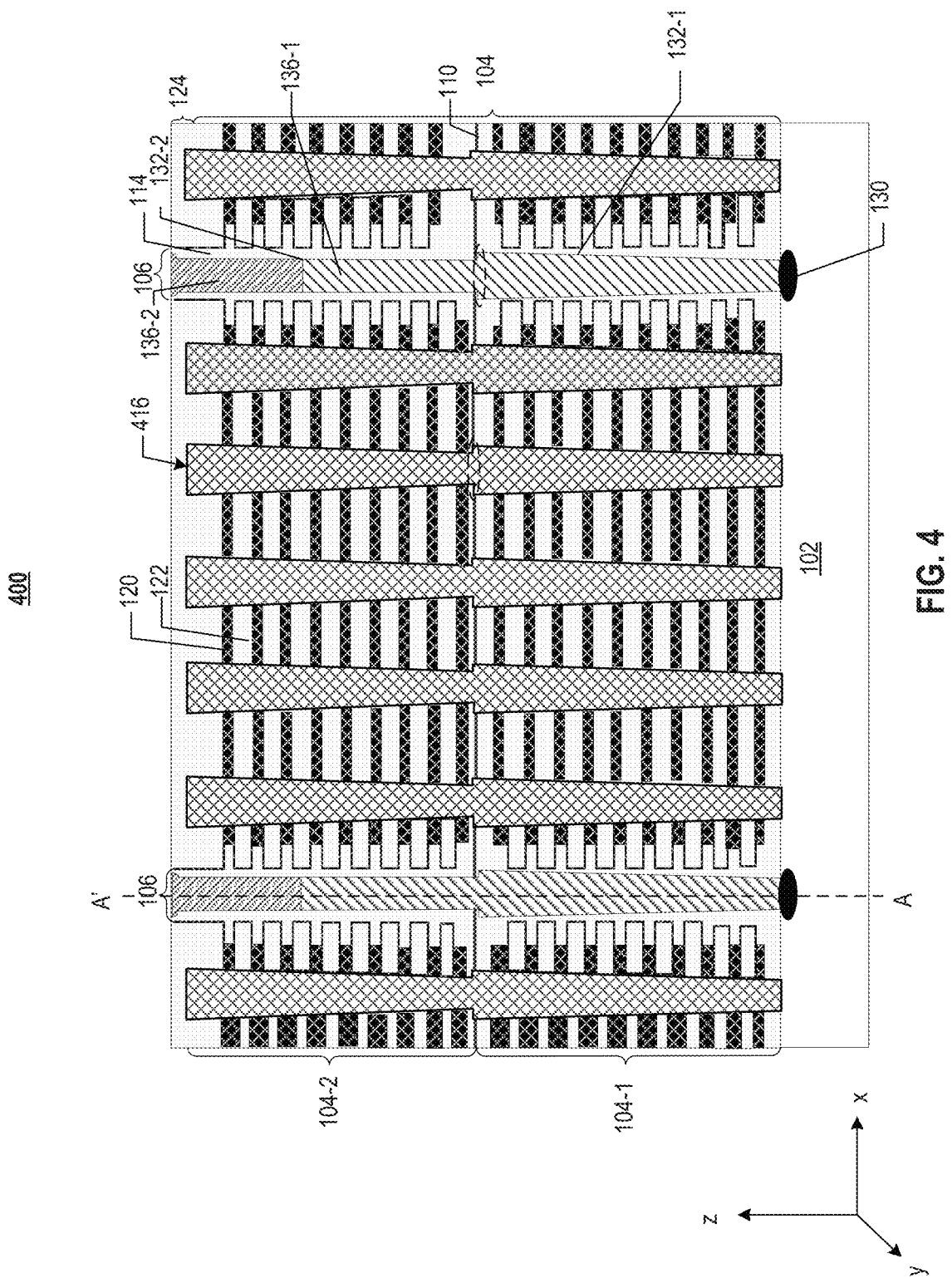
FIG. 4 illustrates another cross-sectional view of an exemplary 3D memory device having adjoined source contact structures, according to some embodiments of the present disclosure.

FIG. 4 illustrates a cross-sectional view of 3D memory device 100 along the x-z plane, in the staircase region ("SS region" in FIG. 1B), according to some embodiments. As referring back to FIG. 1B, source contacts 132 in the staircase region may not be in contact with source contacts 112 in the core region. In some embodiments, source contact 132 is in contact with source contact 112. In various embodiments, the layout/distribution of source contacts 132 can be the same as or different from the layout/distribution of source contacts 112. In some embodiments, source contacts 132 (e.g., first and second source contact portions 132-1 and 132-2) are formed by the same operations that form source contacts 112. In some embodiments, source contacts 132 and 112 include the same shapes, dimensions, and materials/composition. Details of source contacts 132 can be referred to the description of source contacts 112 and are not repeated herein.

As shown in FIG. 4, 3D memory device 100 may include a plurality of support pillars 416 (e.g., dummy channel structures) in the staircase region, instead of channel structures, according to some embodiments. Support pillars 416 may provide support to 3D memory device 100 during the fabrication process, e.g., the formation of lateral recesses and the conductor layers, such that 3D memory device 100 is less susceptible from collapse. Different from channel structures 116, support pillars 416 may be filled with a support structure that is not conductively connected to substrate 102. In some embodiments, support pillar 416 is filled with a dielectric material, such as silicon oxide, silicon nitride, and/or silicon oxynitride. In some embodiments, support pillar 416 has the same channel-forming structure/layers as channel structures 116, but without a conductive plug at the lower portion. The support structure can be deposited into the first and second channel holes using deposition process that is the same as or different from the deposition process that form the channel-forming layers/structure. A bottom surface of support pillar 416 may be below or on the top surface of substrate 102. In some embodiments, support pillars 416 are formed by forming a plurality of first pillar holes each in contact with a respective second pillar hole, and filling the first and second pillar holes with the dielectric material. The first and second pillar holes can respectively be formed by the same operations that form the first and second channel holes. In various embodiments, the first/second pillar holes and the first/second channel holes can have the same shapes and/or dimensions. In some embodiments, support pillar 416 has a staggered portion at the interface of first and second memory decks 104-1 and 104-2.

According to embodiments of the present disclosure, a memory device includes a substrate, a stack above the substrate, a channel structure, and a source contact structure each extending vertically through the memory stack. The source contact structure includes (i) a plurality of first source contact portions each extending vertically and laterally separated from one another and (ii) a second source contact portion extending vertically over and in contact with the plurality of first source contact portions, the second source contact portion being laterally continuous.

In some embodiments, the plurality of first source contact portions are evenly spaced from one another along a lateral direction.

In some embodiments, along a lateral plane, a cross-section of each of the plurality of first source contact portions includes one of a circular shape, an elliptic shape, a rectangular shape, or a squared shape.

In some embodiments, the plurality of first source contact portions each has one of a cylindrical shape or a trapezoid shape extending in from the second source contact portion to the substrate.

In some embodiments, the plurality of first source contact portions include the same materials.

In some embodiments, the plurality of first source contact portions and the second source contact portions include metal.

In some embodiments, the plurality of first source contact portions include polysilicon and the second source contact portion comprises one or more of polysilicon and metal.

In some embodiments, the channel structure and the source contact structure each includes a staggered portion along the respective sidewall.

In some embodiments, the source contact structure is located between two memory fingers in a memory block in the memory stack.

In some embodiments, the 3D memory device further includes a second source contact structure between two memory blocks in the memory stack. The second source contact structure extends continuously in the memory stack.

In some embodiments, the memory stack includes a plurality of interleaved conductor layers and dielectric layers above the substrate. In some embodiments, the channel structure includes a blocking layer, a memory layer, a tunneling layer, a semiconductor layer, and a dielectric core extending radially from a sidewall of the channel structure towards a center of the channel structure.

According to embodiments of the present disclosure, a memory device includes a substrate, a stack above the substrate, a plurality of channel structures, and a plurality of source contact structures. The source contact structures include a plurality of first source contact structures and a plurality of second source contact structures, each extending vertically through the memory stack. The first source contact structures each includes (i) a plurality of first source contact portions each extending vertically and separated from one another and (ii) a second source contact portion extending vertically over and in contact with the plurality of first source contact portions, the second source contact portion being continuous. The second source contact structures each extends continuously in the memory stack.

In some embodiments, the first source contact structures are each between two fingers in the memory stack, and the second source contact structures are each between two blocks in the memory stack.

In some embodiments, at least one of the first source contact structures is located between a pair of the second source contact structures.

In some embodiments, the plurality of first source contact portions are evenly spaced from one another along a lateral direction.

In some embodiments, along a lateral plane, a cross-section of each of the plurality of first source contact portions includes one of a circular shape, an elliptic shape, a rectangular shape, or a squared shape.

In some embodiments, the plurality of first source contact portions each has one of a cylindrical shape or a trapezoid shape extending in from the second source contact portion to the substrate.

In some embodiments, the plurality of first source contact portions and the plurality of first source contact portions include metal; or the plurality of first source contact portions include polysilicon, and the second source contact portion includes one or more of polysilicon and tungsten.

In some embodiments, the plurality of second source contact portions include one or more of polysilicon and tungsten.

In some embodiments, the channel structure and the first source contact structures each includes a staggered portion along the respective sidewall.

In some embodiments, the memory stack includes a plurality of interleaved conductor layers and dielectric layers above the substrate. In some embodiments, the channel structures each includes a blocking layer, a memory layer, a tunneling layer, a semiconductor layer, and a dielectric core extending radially from a sidewall of the respective channel structure towards a center of the respective channel structure.

According to embodiments of the present disclosure, a method for forming a memory device includes the following operations. A plurality of holes are formed extending vertically in a first dielectric deck that includes interleaved a plurality of first sacrificial layers and a plurality of first dielectric layers over a substrate. A plurality of sacrificial structures are formed in the holes. A second dielectric deck is formed having interleaved a plurality of second sacrificial layers and a plurality of second dielectric layers over the first dielectric deck. A slit opening is formed extending in the second dielectric deck, the slit opening aligned with and over the sacrificial source contact structures. The sacrificial structures are removed through the slit openings such that the slit opening is in contact with the holes to form a slit structure. A plurality of conductor layers are formed in the first and second dielectric decks through the slit structure, forming a memory stack. A source contact structure is formed in the slit structure.

In some embodiments, forming a plurality of channel structure before forming the slit opening.

In some embodiments, the method further includes forming an insulator layer at a bottom of each hole before the formation of the sacrificial source contact structures.

In some embodiments, forming the plurality of sacrificial source contact structures includes depositing a sacrificial material to fill up the holes.

In some embodiments, the method further includes forming an etch stop layer over the first dielectric deck.

In some embodiments, the method further includes removing portions of the etch stop layer through the slit opening to expose the sacrificial source contact structures before the removal of the sacrificial source contact structures.

In some embodiments, the method further includes removing the plurality of first and second sacrificial layers through the slit structure to form a plurality of lateral recesses, and depositing a conductor material to fill in the lateral recesses and form the conductor layers.

In some embodiments, forming the source contact structure includes depositing polysilicon and/or tungsten over the polysilicon in the slit structure.

In some embodiments, the method further includes forming, in a same process that forms the plurality of holes, a first channel hole extending vertically in the first dielectric deck.

In some embodiments, the method further includes forming a first channel hole extending vertically in the first dielectric deck after the formation of the plurality of holes.

In some embodiments, the method further includes forming a first channel hole extending vertically in the first dielectric deck prior to the formation of the plurality of holes; or forming a first channel hole extending vertically in the first dielectric deck with of the plurality of holes simultaneously.

In some embodiments, the method further includes forming an epitaxial portion at a bottom of the first channel hole. The oxide is deposited at the bottom of each slit opening before the formation of the epitaxial portion.

In some embodiments, the method further includes, in a same process that forms the sacrificial source contact structures, depositing the sacrificial material to fill up the first channel hole to form a sacrificial channel structure.

In some embodiments, the etch stop layer covers at least portions of the first dielectric deck between adjacent sacrificial source contact structures.

In some embodiments, the method further includes, before forming the slit opening, forming a second channel hole extending vertically in the second dielectric deck, the second channel hole being vertically aligned with the sacrificial channel structure. In some embodiments, the method further includes removing portions of the etch stop layer through the second channel hole to expose the sacrificial channel structure, and removing the sacrificial channel structure such that the second channel hole is in contact with the first channel hole to form a channel hole. In some embodiments, the method further includes forming a channel structure in the channel hole.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a memory device, comprising:
   forming holes extending vertically in a first dielectric deck comprising interleaved first sacrificial layers and first dielectric layers over a substrate;
   forming sacrificial source contact structures in the holes;
   forming a second dielectric deck comprising interleaved second sacrificial layers and second dielectric layers over the first dielectric deck;
   forming a slit opening extending vertically and laterally in the second dielectric deck, the slit opening being aligned with and exposing the sacrificial source contact structures;
   removing the sacrificial source contact structures through the slit opening such that the slit opening is interconnected with the holes; and
   forming a source contact structure in the slit opening and the holes.

2. The method of claim 1, further comprising forming a channel structure before forming the slit opening.

3. The method of claim 1, further comprising forming an insulator layer at a bottom of each hole before the formation of the sacrificial source contact structures.

4. The method of claim 1, wherein forming the sacrificial source contact structures comprises depositing a sacrificial material to fill up the holes.

5. The method of claim 4, further comprising forming an etch stop layer over the first dielectric deck.

6. The method of claim 5, further comprising removing portions of the etch stop layer through the slit opening to expose the sacrificial source contact structures before the removal of the sacrificial source contact structures.

7. The method of claim 5, further comprising forming, in a same process that forms the holes, a first channel hole extending vertically in the first dielectric deck.

8. The method of claim 7, further comprising forming an epitaxial portion at a bottom of the first channel hole.

9. The method of claim 8, further comprising, in a same process that forms the sacrificial source contact structures, depositing the sacrificial material to fill up the first channel hole to form a sacrificial channel structure.

10. The method of claim 9, further comprising, before forming the slit opening,
    forming a second channel hole extending vertically in the second dielectric deck, the second channel hole being vertically aligned with the sacrificial channel structure;
    removing portions of the etch stop layer through the second channel hole to expose the sacrificial channel structure;
    removing the sacrificial channel structure such that the second channel hole is interconnected with the first channel hole to form a channel hole; and
    forming a channel structure in the channel hole.

11. The method of claim 8, wherein the etch stop layer covers at least portions of the first dielectric deck between adjacent sacrificial source contact structures.

12. The method of claim 1, further comprising:
    removing the first and second sacrificial layers through the slit opening and the holes to form lateral recesses; and
    depositing a conductor material to fill in the lateral recesses and form conductor layers.

13. The method of claim 1, wherein forming the source contact structure comprises:
    depositing polysilicon in the holes and the slit opening; and
    depositing tungsten over the polysilicon in the slit opening.

14. The method of claim 1, further comprising forming a first channel hole extending vertically in the first dielectric deck after the formation of the holes.

15. The method of claim 1, further comprising; forming a first channel hole extending vertically in the first dielectric deck prior to the formation of the holes; or
    forming a first channel hole extending vertically in the first dielectric deck with the holes simultaneously.

16. A method for forming a semiconductor structure, comprising:
    forming an opening in a stack structure, the opening comprising:
        a slit vertically extending through an upper portion of the stack structure and laterally along a first lateral direction, and
        through holes vertically extending through a lower portion of the stack structure and laterally aligned along the first lateral direction; and
    forming a source contact structure in the opening, the source contact structure comprising:
        an upper source contact portion laterally extending in the slit, and
        lower source contact portions in the through holes, respectively.

17. The method of claim 16, wherein forming the opening comprises:
    forming the through holes in the lower portion of the stack structure;
    forming sacrificial source contact structures in the through holes;
    forming the upper portion of the stack structure on the lower portion of the stack structure;
    forming the slit in the upper portion of the stack structure to expose the sacrificial source contact structures; and
    removing the sacrificial source contact structures through the slit.

18. The method of claim 17, further comprising:
    forming a lower channel holes in the lower portion of the stack structure in a same process of forming the through holes;
    forming sacrificial channel structures in the lower channel holes in a same process of forming the sacrificial source contact structures;
    forming upper channel holes in the upper portion of the stack structure, each upper channel hole is aligned with a corresponding sacrificial channel structure;
    removing the sacrificial channel structures through the upper channel holes to form channel holes in a same process of removing the sacrificial source contact structures; and
    forming channel structures in the lower channel holes.

19. The method of claim 16, wherein forming the source contact structure comprises:
    depositing a first conductive material in the through holes and a lower portion of the slit to form the lower source contact portions and a lower portion of the upper source contact portion; and depositing a second conductive material in an upper portion of the slit to form the lower source contact portions and an upper portion of the upper source contact portion.

20. The method of claim 16, wherein forming the source contact structure comprises:
simultaneously forming a first source contact structure in a core region and a second source contact structure in a staircase region, wherein the upper source contact portion of the first source contact structure is disconnected with the upper source contact portion of the second source contact structure.

* * * * *